United States Patent [19]

Tsuruoka

[11] Patent Number: 5,141,321
[45] Date of Patent: Aug. 25, 1992

[54] IMAGE RECEIVING APPARATUS AND ALIGNMENT METHOD FOR CONTROLLING FREQUENCY OF PULSED EMISSION ILLUMINATING LIGHT

[75] Inventor: Yuji Tsuruoka, Kawasaki, Japan

[73] Assignee: Canon Kabushiki Kaisha, Tokyo, Japan

[21] Appl. No.: 646,095

[22] Filed: Jan. 25, 1991

[30] Foreign Application Priority Data

Jan. 31, 1990 [JP] Japan ................. 2-019230

[51] Int. Cl.⁵ ............................. G01B 9/02
[52] U.S. Cl. ............................ 356/400; 250/205
[58] Field of Search ......... 356/400, 401; 250/548, 250/234, 208.1, 205

[56] References Cited

U.S. PATENT DOCUMENTS

| 4,634,876 | 1/1987 | Ayata | 250/548 |
| 4,645,347 | 2/1987 | Rioux | 250/208.1 |
| 5,048,967 | 9/1991 | Suzuki et al. | 356/400 |
| 5,053,614 | 10/1991 | Yui et al. | 250/205 |

Primary Examiner—Samuel A. Turner
Assistant Examiner—Richard E. Kurtz, II
Attorney, Agent, or Firm—Fitzpatrick, Cella, Harper & Scinto

[57] ABSTRACT

An image receiving apparatus includes a light source for emitting a pulsed light beam, a shifting device for progressively shifting the light beam emitted from the light source, an imaging device for receiving image information related to an object illuminated by the shifted beam from the shifting device as electric signals, an image integrating unit for integrating the electric signals received by the imaging device to generate integrated image information, and a controller for controlling a repetition frequency of the pulsed emission of the light source and a shifting period of the shifting device in synchronization with a timing for receiving image information by the imaging device. The image receiving apparatus of the present invention can be utilized to perform alignment of an object. A method to perform such alignment is also disclosed.

22 Claims, 3 Drawing Sheets

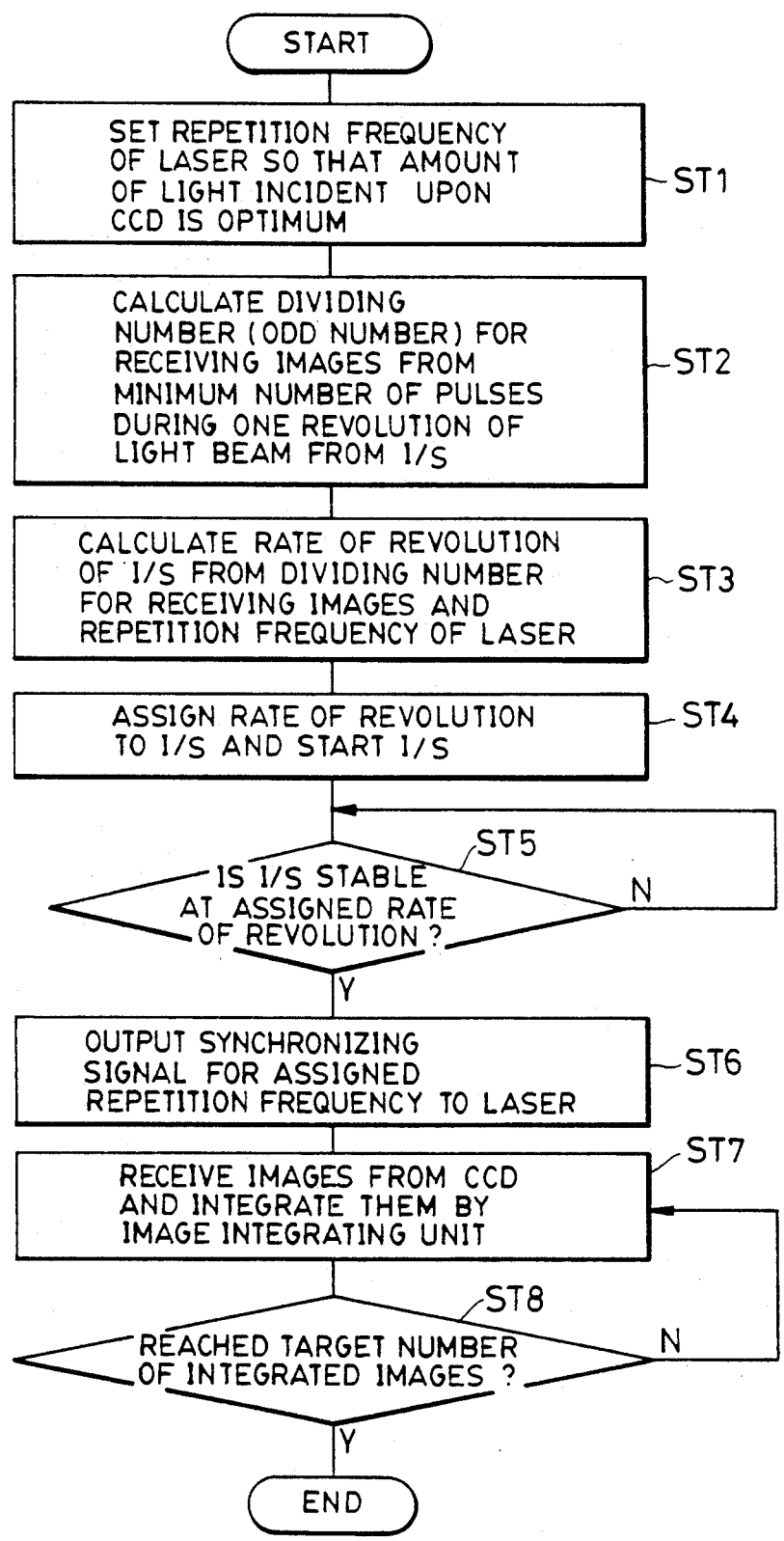

IMAGE RECEIVING APPARATUS AND ALIGNMENT METHOD FOR CONTROLLING FREQUENCY OF PULSED EMISSION ILLUMINATING LIGHT

BACKGROUND OF THE INVENTION

1. Field of the Invention

This invention relates to an image receiving apparatus which uses pulsed light as illuminating light.

2. Description of the Prior Art

Image receiving apparatuses which use laser light as illuminating light have been well known. In order to reduce unevenness in illuminance in such apparatuses, a method, such as described in U.S. Pat. No. 4,634,876, has been used wherein a laser beam scans an object to be observed, and an image of the object is received while the light storage time of an image sensor is controlled in accordance with the scanning frequency of the laser beam, as described in U.S. Pat. No. 4,634,876.

SUMMARY OF THE INVENTION

Recently, pulsed light sources, such as excimer lasers, or the like, have been used as illuminating light. When using such light sources, it is difficult to obtain an optimum image having little unevenness in illuminance, merely by receiving an image while controlling the light storage time of an image sensor in accordance with the scanning frequency of a light beam, because of the following reasons:

1. Since the emission timing of the pulsed light is not synchronized with the scanning timing of the beam, unevenness in illuminance by an amount of one pulse is produced.
2. When excimer laser light is used as the illuminating light, the emission frequency of the excimer laser is as low as several hundreds of Hz (Hertz). Therefore, a case may occur wherein the time needed for one scanning of the beam is longer than the time during which charge can be stored in a CCD. As a result, the light storage time of an image sensor cannot be controlled in accordance with the scanning frequency of the beam.

The present invention has been made in consideration of the above-described problems in the prior art.

It is an object of the present invention to provide an image receiving apparatus wherein an optimum image, having little unevenness in illuminance, can be obtained.

In order to achieve the above-described object, an image receiving apparatus according to the present invention comprises shifting means for receiving illuminating light in the form of pulsed light from a light source and for emitting the beam of light while progressively shifting the beam to illuminate an object, imaging means for receiving information as electric signals, regarding an image illuminated by the shifting beam emitted from the shifting means, image integrating means for integrating the electric signals received by the imaging means to generate image data, and control means for controlling the emission repetition frequency of the pulsed laser and the shifting period of the shifting means to be in synchronization with the image information receiving timing of the imaging means.

The shifting means of the present invention can comprise a beam shifter for progressively shifting a light beam emitted from a light source in a path along a circumference of a circle to illuminate an object with the shifted light beam. Further, the image information generated by the imaging means can be utilized to align an object.

The control means of the image receiving apparatus of the present invention can also relatively control timing for receiving the image information by the imaging means and repetition frequency of the pulsed emission of light from the light source to define a predetermined relationship between the timing for receiving the image information by the imaging means and the repetition frequency of the pulsed emission of light from the light source.

The control means of the image receiving apparatus of the present invention can also relatively control a rate of revolution of the beam shifter and a repetition frequency of the pulsed emission of light from the light source to define a predetermined relationship between the rate of revolution of the beam shifter and the repetition frequency of the pulsed emission of light from the light source.

The present invention also provides an alignment method for aligning an object. The alignment method includes setting a repetition frequency of pulsed emission of light from a light source to emit a pulsed light beam to illuminate the object; determining a stabilized rate of revolution of a beam shifter for progressively shifting the light beam emitted from the light source in a path along a circumference of a circle on the object, corresponding to the repetition frequency of the light source set in the setting step; starting revolution of the beam shifter; receiving, as electric signals, image information related to the object illuminated by the light beam from the beam shifter at a predetermined timing a plurality of times once the rate of revolution of the beam shifter has stabilized, as determined in the determining step; integrating respective electric signals received in the imaging step to generate integrated image information; and aligning the object in accordance with the image information integrated in the integrating step.

It is preferred that the image integrating timing of the image integrating means can be controlled externally, and also, that the frequency of the image integrating operations can be set in advance.

It is also preferred that the apparatus further comprise means for controlling the image integrating timing of the image integrating means in synchronization with the emission timing of the pulsed laser.

A pulsed light beam emitted from a pulsed laser, such as an excimer laser, or the like, generally has unevenness in illuminance within the pulsed beam greater than that within a light beam emitted from a continuous light source, such as a mercury-vapor lamp. Hence, if an image is illuminated while correcting the beam, unevenness in illuminance on the image cannot be suppressed to within a permissible range, even if the image is illuminated using a plurality of pulses. Accordingly, in the present invention, while shifting the beam, for example, in a path along a circumference of a circle by a shifting means, such as an image shifter, or the like, an excimer laser is triggered in synchronization with the shifting period of the beam. Thus, the locus of the center of the optical axis of the beam depicts, for example, a circle, and the emissions of the laser are always produced at a plurality of fixed points equally dividing the circumference of the circle. By illuminating an image with the number of emission pulses necessary for one complete revolution of the center of the optical axis, unevenness in illuminance is minimized, and is limited to within a permissible range.

However, the image receiving period for an imaging device, such as a CCD camera, or the like, is fixed, for example, to 1/60 of a second per field, in the case of interlaced scanning. Hence, if an image is received as it is generated, the received image cannot be used as an image to be processed because unevenness in illuminance is great. The unevenness in illuminance can be further minimized by synchronizing the emission timing of the laser and the shifting period of the shifting means with the image receiving period of the imaging means, and by integrating images thereby obtained for several revolutions of the shifting means.

BRIEF DESCRIPTION OF THE DRAWINGS

FIG. 5 is a flowchart showing processing using the FIG. 1 apparatus.

DETAILED DESCRIPTION OF THE PREFERRED EMBODIMENTS

Figure 1:
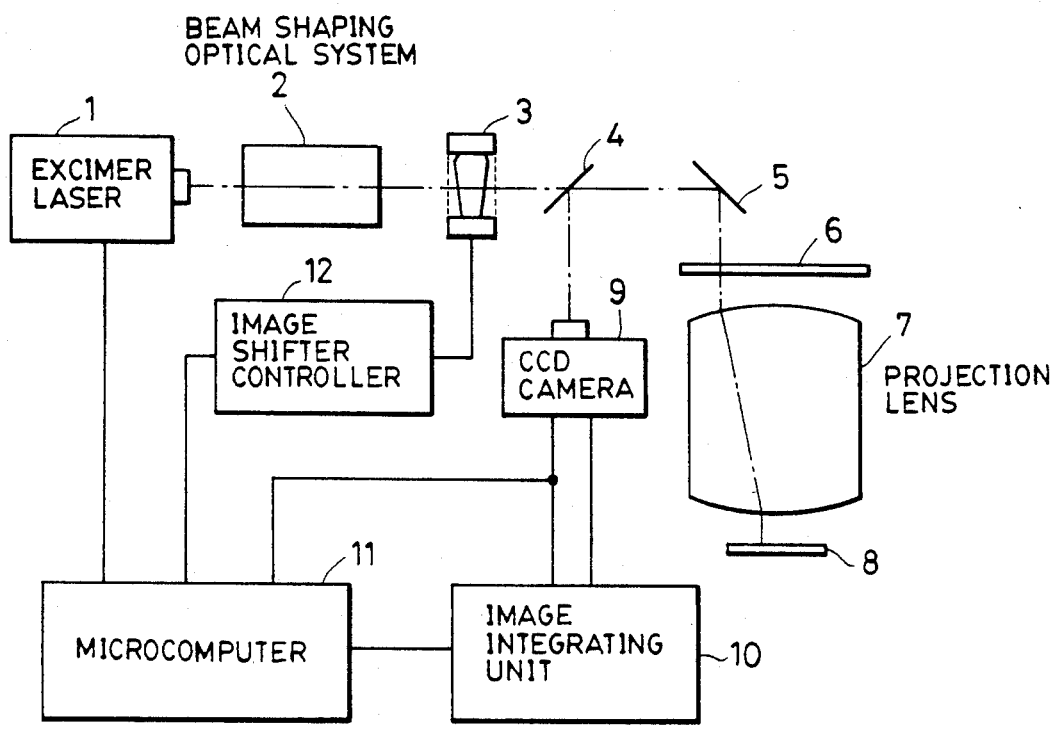
FIG. 1 is a diagram showing the configuration of an apparatus according to an embodiment of the present invention.

FIG. 1 is a diagram showing the configuration of an apparatus which represents specific features of the present invention. An excimer laser 1, which comprises a gas laser containing KrF, or the like, serves as a light source for generating pulsed laser light. The generated pulsed light is shaped into a desired beam size by a beam shaping optical system 2, and the shaped beam is incident upon an image shifter 3. The image shifter 3, which comprises an optical system for progressively shifting the incident beam in a path along a circumference of a circle and for outputting the shifted beam, can include a wedge rotated by a motor, for example. The beam shifted by the image shifter 3 passes through a half-mirror 4, is reflected by a mirror 5, and reaches a reticle 6. An alignment pattern and an integrated-circuit pattern are formed on the reticle 6. When aligning the reticle 6 with a wafer 8, the alignment pattern on the reticle 6 is projected by the laser beam emitted from the excimer laser 1 through a projection lens system 7 onto wafer 8. Likewise, when printing the integrated-circuit pattern on the reticle 6 onto the wafer 8, the wafer 8 is exposed through the reticle 6 by the light beam emitted from the excimer laser 1.

Figure 2:
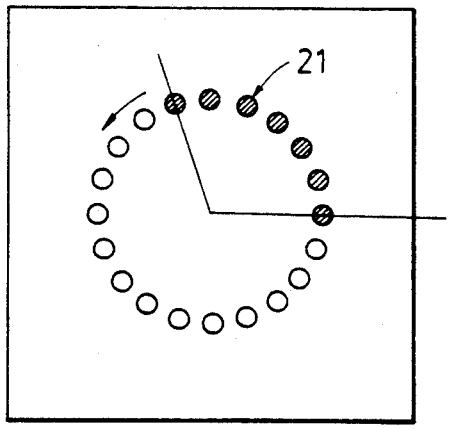
FIG. 2 is a locus of the center of the optical axis of a laser beam shifted by an image shifter.

The pulsed light beam emitted from the excimer laser 1 generally has unevenness in illuminance within the pulsed beam greater than that within a light beam emitted from a continuous light source, such as a mercury-vapor lamp. Hence, if the wafer 8 is exposed while correcting the beam, unevenness in illuminance on the wafer 8 cannot be suppressed to within a permissible range, even if the wafer 8 is exposed using a plurality of pulses. Accordingly, in the present embodiment, while shifting the beam in a path along a circumference of a circle by the image shifter 3, the excimer laser 1 is triggered in synchronization with the shifting period of the beam. Thus, the locus of the center of the optical axis of the beam subsequent to the half-mirror 4 depicts a circle, as shown in FIG. 2, and the emissions of the laser 1 are always produced at a plurality of fixed points (20 points in FIG. 2), equally dividing the circumference of the circle. By exposing the wafer 8 with the number of emission pulses (20 times in FIG. 2) necessary for one complete revolution of the center of the optical axis on the circumference, unevenness in illuminance is minimized, and is limited to within a permissible range.

In FIG. 1, the beam, which is reflected by the wafer 8 during the alignment of the reticle 6 with the wafer 8, passes through the projection lens 7 and the reticle 6, is reflected by the mirror 5 and the half-mirror 4, and is incident upon the imaging surface of a CCD camera 9. As a result, it is possible to simultaneously observe two alignment patterns formed on the wafer 8 and the reticle 6 using the CCD camera 9. By processing these images, it is possible to monitor a relative position between the wafer 8 and the reticle 6.

However, the image receiving period for the CCD camera 9 is fixed to 1/60 of a second per field in the case of interlaced scanning. Hence, if the images are received as they are generated, the received images cannot be used as images to be processed because unevenness in illuminance is great. Accordingly, when receiving the images, as when exposing the images, it is necessary to minimize the unevenness in illuminance by (1) controlling the emission timing of the excimer laser 1 and the rate of revolution of the image shifter 3, (2) synchronizing the emission timing and the rate of revolution with the receiving period of the CCD camera 9, and (3) integrating the images thereby obtained for several sets of revolutions of the center of the optical axis shown in FIG. 2. The image integrating operation is performed by an image integrating unit 10, which is connected to a microcomputer 11 in order to perform synchronizing control and image processing for receiving the images. In order to perform synchronizing control for receiving the images, the microcomputer 11 is connected to the image shifter 3 via an image shifter controller 12 to control the rate of revolution of the image shifter 3, and is also connected to the CCD camera 9 to provide vertical synchronization (VD signals) therefrom.

Figure 3:
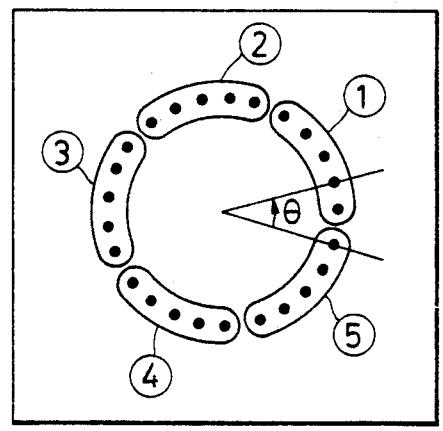
FIG. 3 is a diagram showing the movement of the optical axis and the image receiving timings when images are received using the FIG. 1 apparatus.

An image receiving method to minimize unevenness in illuminance will now be explained in detail. FIG. 3 shows a locus of the center of the optical axis of the beam incident upon the CCD camera 9. When the image shifter 3 performs one revolution, the locus of the center of the optical axis of the beam performs one revolution on the circumference. If the rate of revolution of the image shifter 3 is synchronized with the repetition frequency of the excimer laser 1, the emission timings of the laser 1 are always fixed at positions equally dividing the circumference, as shown in FIG. 3. An example is a case wherein 25 pulses of laser emission are produced for every revolution of the center of the optical axis. If the repetition frequency of the excimer laser 1 is set to 300 Hz, so that five emission pulses are received during one field receiving period of the CCD camera 9, five field receiving operations are performed while the center of the optical axis performs one revolution on the circumference.

Figure 4:
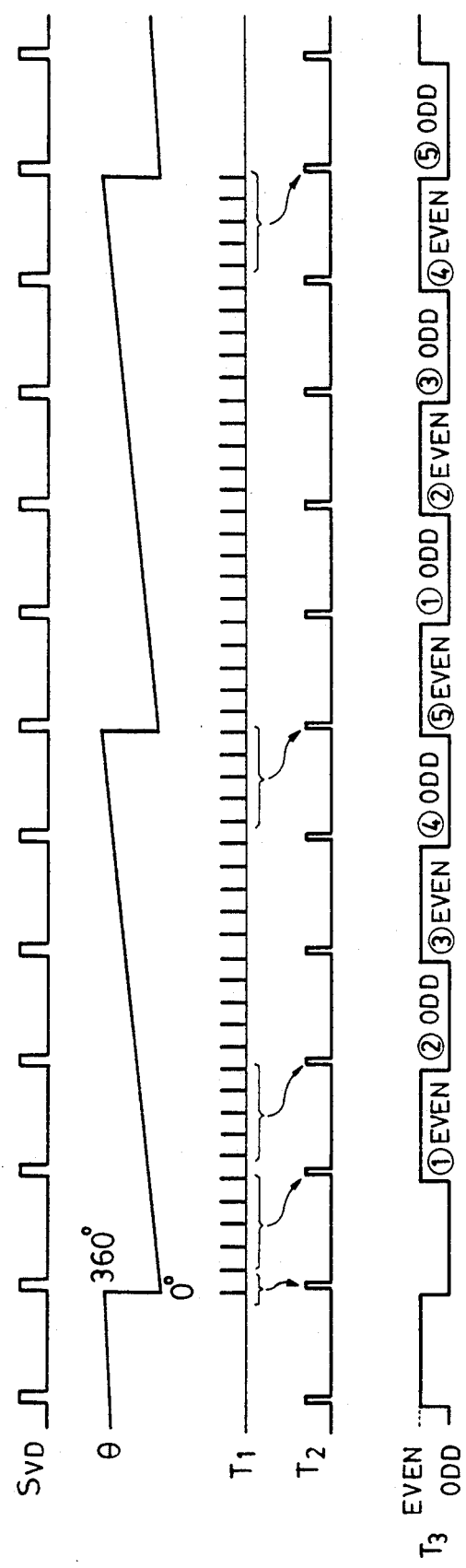
FIG. 4 illustrates timing charts when an image is received using the FIG. 1 apparatus.

An explanation will now be provided of image receiving timings with reference to FIG. 4, wherein the five receiving periods are represented by ①-⑤. In FIG. 4, VD signals $S_{vd}$ from the CCD camera 9 are signals output from the camera 9 in synchronization with field receiving timings $T_3$. If the excimer laser 1 is triggered with the repetition frequency of 300 Hz, as shown by timing $T_1$, from the leading edge of an arbitrary VD signal $S_{VD}$, and the angle $\theta$ of movement (see FIG. 3) of the center of the optical axis on the circumference at that time is assumed to be 0°, five VD signals $S_{VD}$ are output until the center of the optical axis moves to 360°. Since the time from the leading edge of the VD signal $S_{VD}$ to an electric charge receiving timing $T_2$ by the CCD camera 9 is generally several tens of $\mu s$ (microseconds), the first emission pulse of the laser emission pulses $T_1$ is received at the nearest electric charge receiving timing $T_2$ following it. Since the maximum repetition frequency of the excimer laser 1 is generally about 1 kHz (kilohertz), the emission period of the laser 1 is 1 ms (millisecond) or more, and the subsequent five pulses are accurately received at the next electric charge receiving timing $T_2$. The received electric charges correspond to five emission pulses at the receiving period ①. If it is assumed that the electric charges are read as an even field, an odd field representing the period ② is read at the next reading operation as shown in output fields $T_3$ from the CCD camera 9. Subsequently, image signals can be sequentially received as an even field for the period ③, an odd field for the period ④ and an even field for the period ⑤ until the angle $\theta$ of movement of the center of the optical axis becomes 360°. However, an integrated image for one revolution of the center of the optical axis for each of the odd and even fields cannot be obtained by the above-described image integrating operation for five fields, but can be obtained by further continuously integrating images for another one complete revolution. Since fields must be inverted between odd and even at respective receiving periods during the first revolution and the second revolution, the number of image receiving fields during one revolution of the center of the optical axis must be set to be an odd number.

As described above, it is possible to obtain an image having minimum unevenness in illuminance.

FIG. 5 shows a process flowchart for the microcomputer 11 during the above-described operation. In FIG. 5, at step ST1, the microcomputer 11 first sets the repetition frequency of the excimer laser 1, as will be described later, so that the amount of light incident upon the CCD 9 is optimum. Subsequently, the number of divided sections for receiving images (hereinafter termed the "dividing number"), as shown by ①-⑤ in FIG. 3, is calculated from the number of pulses (the number of emissions of the excimer laser 1) generated when the image shifter (I/S) 3, that is, the center of the optical axis of the beam from the image shifter 3, performs one revolution on the circumference. The dividing number is determined so that it is an odd number.

After calculating the dividing number, at step ST3, the microcomputer 11 calculates the rate of revolution (the speed of revolution) of the image shifter 3 from the dividing number for receiving images and the repetition frequency of the excimer laser 1. At step ST4, the microcomputer 11 assigns the rate of revolution to a driving source of the image shifter 3, and starts the driving source. At step ST5, the microcomputer 11 determines whether or not the actual rate of revolution of the image shifter 3 is stabilized at the assigned rate of revolution. After it has been confirmed that the image shifter 3 has been stabilized, the process proceeds to step ST6.

At step ST6, synchronizing signals are output in order to repeatedly trigger the excimer laser 1 at the assigned frequency. An image receiving operation by the CCD 9 is started, and image receiving signals for that operation are integrated by the image integrating unit 10. Subsequently, at step ST8, the microcomputer 11 determines whether or not the number of images integrated by the integrating unit 10 has reached a target value. If the number has reached the target value, the image integrating operation by the integrating unit 10 is terminated, and an operation to calculate alignment errors between the reticle 6 and the wafer 8 is started using an integrated output at that time.

The setting of the repetition frequency of the laser 1 at step ST1 is performed by successively receiving an image while changing the repetition frequency of the laser 1, and by making the repetition frequency, when the histogram of the received image is optimum, the assigned frequency. If the amount of light at each emission of the laser 1 is so little that the amount of light incident upon the CCD 9 is insufficient even if the repetition frequency is increased to the maximum value, the insufficiency in the amount of light can be compensated for by setting the repetition frequency at the maximum value, and by increasing the number of integrated images to four or six revolutions of the image shifter 3.

In the process at step ST2, the number of the minimum emission pulses during one revolution of the center of the optical axis is generally determined from characteristics of the optical system and based on the permissible range of unevenness in illuminance. In the present embodiment, that number is several tens of pulses.

Since the amount of light emitted from the laser 1 is, typically, nearly constant, after only once performing the processes at steps ST1-ST3 during the first alignment, it is unnecessary to repeat those processes in subsequent operations, unless the amount of light significantly changes.

However, subsequent alignment operations can be performed as necessary by relatively moving the reticle 6 and the wafer 8. In addition, focusing operations can be performed as necessary by the projection lens 7.

If the CCD camera 9 uses a noninterlaced scanning method, an image for one frame is received during an interval of 1/30 of a second. Hence, by integrating images for one revolution of the center of the optical axis, it is possible to receive an image having little unevenness in illuminance, as in the foregoing embodiment.

If a CCD camera is used which can be externally synchronized and in which the frequency for receiving an image can be varied, an image receiving operation, as in the foregoing embodiment, can be realized by setting the receiving timing of the CCD camera 9 and the rate of revolution of the image shifter 3 in synchronization with the repetition frequency of the laser 1. In this case, since the repetition frequency of the laser 1 always can be fixed at the maximum value, it becomes possible to receive an image at a high speed.

If unevenness in illuminance can be limited to within a permissible range, even if the timing for receiving an image is not strictly synchronized with the emission timing of the laser 1 and the revolution of the image shifter 3, unlike in the foregoing embodiment, images when the center of the optical axis performs several revolutions can be freely integrated by (1) providing an encoder on the revolution shaft of the image shifter 3 to monitor the angle of revolution of the image shifter 3 so that a command for receiving an image is output when the angle of revolution has reached a desired value, and (2) receiving an image signal output from the CCD camera 9 immediately after the output timing of the command so that images can be integrated. Hence, it becomes possible to receive an image having unevenness in illuminance limited to within a permissible range. In this case, since the emission timing of the laser 1 need not be synchronized with the image receiving period of the CCD camera 9, it becomes possible to set the repetition frequency of the laser 1 to a maximum value, and to receive images at a high speed. Furthermore, as the image integrating unit 10, a unit which does not continuously integrate images also can be used.

As explained above, if the repetition frequency of the excimer laser and the rate of revolution of the image shifter are set in synchronization with the image receiving period of the CCD camera by continuously integrating images for the amount of even-numbered (for example, 2, 4, and 6) shifting operations of the shifting means, for example, in the case of interlaced scanning, the following effects may be obtained:

(1) With respect to an image illuminated by pulsed light having great unevenness in illuminance, it is possible to obtain an image having little unevenness in illuminance.

(2) Even if the amount of light of a light source itself is small, it is possible to compensate for the insufficiency in the amount of light by increasing the number of integrated images, and thus, to obtain an optimum image.

(3) It is possible to remove any noise in an image utilizing a smoothing affect by integrating the images.

Except as otherwise disclosed herein, the various components shown in outline or in block form in FIG. 1 are individually well known and their internal construction and operation are not critical either to the making or using of this invention or to a description of the best mode of the invention.

What is claimed is:

1. An image receiving apparatus comprising:
    a light source for emitting a pulsed light beam;
    shifting means for receiving the light beam emitted from said light source and for shifting the received light beam in a desired manner;
    illuminating means for receiving the light beam shifted by said shifting means and for illuminating an object with the shifted light beam;
    imaging means for receiving, as electric signals, image information related to the object illuminated by the shifted light beam;
    image integrating means for integrating the electric signals received by said imaging means to generate integrated image information; and
    control means for controlling a repetition frequency of the pulsed emission of the light beam from said light source and for controlling a shifting period of said shifting means to be in synchronization with a timing for receiving the image information by said imaging means.

2. An image receiving apparatus according to claim 1, wherein said light source comprises an excimer laser, and said imaging means comprises a CCD camera.

3. An image receiving apparatus according to claim 1, wherein said image integrating means comprises means for changing an integrating timing of said imaging means and the number of integrating operations of the image information performed by said imaging means.

4. An image receiving apparatus according to claim 3, wherein said control means comprises means for synchronizing the image integrating timing of said image integrating means with a pulse emission timing of said light source.

5. An image receiving apparatus according to claim 1, wherein said shifting means comprises means for progressively shifting the light beam emitted from said light source in a path along a circumference of a circle.

6. An image receiving apparatus comprising:
    a light source for emitting a pulsed light beam to illuminate an object;
    a beam shifter for progressively shifting the light beam emitted from said light source in a path along a circumference of a circle to illuminate the object with the shifted light beam;
    imaging means for receiving, as electric signals, image information related to the object illuminated by the shifted light beam;
    image integrating means for integrating the electric signals received by said imaging means to generate integrated image information utilized for aligning the object; and
    control means for controlling a timing for receiving the image information by said imaging means and a repetition frequency of the pulsed emission of light from said light source, and for defining a relationship between the timing for receiving the image information by said imaging means and the repetition frequency of the pulsed emission of light from said light source.

7. An image receiving apparatus according to claim 6, wherein said imaging means comprises means for receiving the image information using interlaced scanning.

8. An image receiving apparatus according to claim 7, wherein said imaging means comprises means for receiving the image information an odd number of times during shifting of the light beam by said beam shifter one complete revolution of the circumference of the circle.

9. An image receiving apparatus according to claim 8, wherein said image integrating means comprises means for terminating integration of the image information once said beam shifter has shifted the light beam an even number of revolutions of the light beam along the circumference of the circle.

10. An image receiving apparatus according to claim 6, wherein said control means comprises means for controlling repetition frequency of the pulsed emission of light from said light source and a rate of revolution of said image shifter, and for defining a relationship between the repetition frequency of the pulsed emission of light from said light source and the rate of revolution of said image shifter.

11. An image receiving apparatus according to claim 10, wherein said imaging means comprises means for receiving the image information using interlaced scanning.

12. An image receiving apparatus according to claim 11, wherein said imaging means comprises means for receiving the image information an odd number of times during shifting of the light beam by said beam shifter one complete revolution of the circumference of the circle.

13. An image receiving apparatus according to claim 12, wherein said image integrating means comprises means for terminating integration of the image information once said beam shifter has shifted the light beam even number of revolutions of the light beam along the circumference of the circle.

14. An image receiving apparatus comprising:
   a light source for emitting a pulsed light beam to illuminate an object;
   a beam shifter for progressively shifting the light beam emitted from said light source in a path along a circumference of a circle to illuminate the object with the shifted light beam;
   imaging means for receiving, as electric signals, image information related to the object illuminated by the shifted light beam;
   image integrating means for integrating the electric signals received by said imaging means to generate integrated image information utilized for aligning the object; and
   control means for controlling a rate of revolution of said beam shifter and a repetition frequency of the pulsed emission of light from said light source, and for defining a relationship between the rate of revolution of said beam shifter and the repetition frequency of the pulsed emission of said light source.

15. An image receiving apparatus according to claim 14, wherein said light source comprises an excimer laser, and said imaging means comprises a CCD camera.

16. An alignment method for aligning an object, said method comprising the steps of:
   setting a repetition frequency of pulsed emission of light from a light source to emit a pulsed light beam to illuminate the object;
   determining a stabilized rate of revolution of a beam shifter for progressively shifting the light beam emitted from the light source in a path along a circumference of a circle on the object, corresponding to the repetition frequency of the light source set in said setting step;
   starting revolution of the beam shifter;
   receiving, as electric signals, image information related to the object illuminated by the light beam from the beam shifter at a predetermined timing a plurality of times once the rate of revolution of the beam shifter has stabilized, as determined in said determining step;
   integrating respective electric signals received in said receiving step to generate integrated image information; and
   aligning the object in accordance with the image information integrated in said integrating step.

17. An alignment method according to claim 16, wherein said receiving step comprises receiving image information a plurality of times while the light beam is shifted by the beam shifter one complete revolution around the circumference of the circle.

18. An alignment method according to claim 16, wherein said receiving step comprises interlaced scanning for receiving image information.

19. An alignment method according to claim 18, further comprising performing said receiving step an odd number of times while the light beam is shifted by the beam shifter one complete revolution around the circumference of the circle.

20. An alignment method according to claim 19, further comprising terminating the integration in said integrating step once the light beam has been shifted by the beam shifter an even number of times along the circumference of the circle.

21. An alignment method according to claim 16, further comprising synchronizing the repetition frequency of the pulsed emission of light from the light source and the rate of revolution of the image shifter with the receiving of the image information in said receiving step.

22. An alignment method according to claim 21, further comprising utilizing an excimer laser as the light source and utilizing a CCD camera for receiving imaging information in said receiving step.

* * * * *

UNITED STATES PATENT AND TRADEMARK OFFICE
CERTIFICATE OF CORRECTION

PATENT NO. : 5,141,321
DATED : August 25, 1992
INVENTOR(S) : Yuji Tsuruoka

It is certified that error appears in the above-identified patent and that said Letters Patent is hereby corrected as shown below:

COLUMN 5

Line 22, "fields" should read --field--.

COLUMN 6

Line 28, "uneveness" should read --unevenness--.

COLUMN 9

Line 2, "even" should read --an even--.

Signed and Sealed this

Twenty-eighth Day of September, 1993

Attest:

BRUCE LEHMAN

*Attesting Officer*    *Commissioner of Patents and Trademarks*